United States Patent
Schlenga

(10) Patent No.: US 7,865,221 B2
(45) Date of Patent: Jan. 4, 2011

(54) MAGNETIC FIELD COIL WITH SUPERCONDUCTING CAPABILITY AND PARALLEL WOUND WIRE SECTIONS IN A LAYER

(75) Inventor: Klaus Schlenga, Linkenheim (DE)

(73) Assignee: Bruker Biospin GmbH, Rheinstetten (DE)

( * ) Notice: Subject to any disclaimer, the term of this patent is extended or adjusted under 35 U.S.C. 154(b) by 724 days.

(21) Appl. No.: 11/878,013

(22) Filed: Jul. 20, 2007

(65) Prior Publication Data
US 2008/0139394 A1    Jun. 12, 2008

(30) Foreign Application Priority Data
Jul. 28, 2006   (DE)   ........................ 10 2006 035 751

(51) Int. Cl.
  *H01F 6/00* (2006.01)
(52) U.S. Cl. ........................ 505/211; 505/705; 335/216; 336/186; 336/84 M; 29/599
(58) Field of Classification Search ................. 505/211, 505/400, 705, 727; 324/318, 322; 335/216, 335/296, 219, 299; 174/125.1; 29/599
See application file for complete search history.

(56) References Cited

U.S. PATENT DOCUMENTS 4,559,576 A * 12/1985 Ries .............................. 361/19
4,727,346 A * 2/1988 Westphal et al. ............ 335/216
5,235,281 A   8/1993 Haragashira et al.
5,289,129 A   2/1994 Joseph
5,319,333 A * 6/1994 Roth et al. .................. 335/216
6,358,888 B1  3/2002 Eckels
2006/0268471 A1  11/2006 Lee et al.

FOREIGN PATENT DOCUMENTS

| GB | 1 255 265  |   | 12/1971 |
| JP | 2000277321 | * | 10/2000 |
| JP | 2006313923 | * | 6/2006 |
| JP | 2006313923 |   | 11/2006 |

OTHER PUBLICATIONS

"Ultrashield" Broshure Bruker BioSpin Corporation (2005).

* cited by examiner

*Primary Examiner*—Stanley Silverman
*Assistant Examiner*—Kallambella Vijayakumar
(74) *Attorney, Agent, or Firm*—Paul Vincent

(57) ABSTRACT

A superconducting magnetic field coil (1; 21; 31; 41; 51; 61) comprising at least one coil section (42; 43) which is wound in layers, is characterized in that, in at least one layer (11, 12, 13, 14, 101, 102, 103, 104) of the coil section (42; 43) N (with N≧2), superconducting wire sections (A, B, C, D, E) are wound in parallel, such that the windings of the N wire sections (A, B, C, D, E) are adjacent to each other and the N wire sections (A, B, C, D, E) are connected in series. The inventive magnetic field coil can be produced at highly reduced costs, in particular, when the magnetic field coil has a comparatively large layer length.

12 Claims, 4 Drawing Sheets

MAGNETIC FIELD COIL WITH SUPERCONDUCTING CAPABILITY AND PARALLEL WOUND WIRE SECTIONS IN A LAYER

This application claims Paris Convention priority of DE 10 2006 035 751.5 filed Jul. 28, 2006 the complete disclosure of which is hereby incorporated by reference.

BACKGROUND OF THE INVENTION

The invention concerns a superconducting magnetic field coil comprising at least one coil section which is wound in layers.

Magnetic field coils of this type are disclosed e.g. by the NMR magnets of the UltraShield product line of the company Bruker BioSpin GmbH, Rheinstetten, DE.

Superconducting magnetic field coils are used to generate magnetic fields of high strength (approximately 20 Tesla or more). Magnetic fields of such high strength are used, in particular, in high-resolution nuclear magnetic resonance (NMR) spectroscopy. Superconducting magnetic field coils are cooled during operation, e.g. using liquid helium in a cryostat.

The magnetic field coils typically have a solenoidal shape and are wound from superconducting wire in layers which are disposed on top of each other and connected in series. The superconducting wire is generally tightly wound within one layer, i.e. neighboring windings of the superconducting wire contact each other. This prevents the windings from being displaced by magnetic forces, in particular, when the magnetic field coil is charged.

Individual parts of the superconducting wire can only be combined outside of the coil using superconducting connecting elements, so-called joints. One piece of wire is therefore conventionally always used to wind an integer number of layers. For producing the coil, only that portion of a wire piece is used which corresponds to the length of an integer multiple of the "layer length" (this is the wire length within one layer). Any residue of the wire piece is discarded ("waste").

Since the production of wires from $Nb_3Sn$ or NbTi superconductors is usually based on bolts of a weight of typically approximately 30 kg to 300 kg, the available wire piece length is determined to a large degree by the conductor cross-section of the wire. In high-temperature superconductors, such as YBaCuO or BiSrCaCuO, the maximum available wire piece length is currently between approximately 100 m and approximately 2000 m.

For magnet coils having very short layer lengths compared to the available wire piece lengths (e.g. due to a short layer length with small coil diameter and/or a thin conductor cross-section e.g. with a conductor weight<10 kg/layer), the waste can be neglected compared to the overall production costs.

For magnetic field coils with layer lengths of the same magnitude as the available lengths of wire pieces (e.g. due to a large coil diameter and/or a large conductor cross-section and therefore high conductor weight/layer, approximately>10 kg/layer), the superconducting wire waste considerably increases the production costs of the magnetic field coil. If e.g. a wire piece of a length corresponding to 1.9 layers is available, the remaining wire of a length that corresponds to 0.9 layers is discarded, e.g. the waste can almost double the material costs for the superconducting wire.

It is therefore the underlying purpose of the present invention to provide a superconducting magnetic field coil which can be produced at much less cost than conventional magnetic field coils, in particular, when the magnetic field coil has a comparatively large layer length.

SUMMARY OF THE INVENTION

This object is achieved by a superconducting magnetic field coil of the above-mentioned type which is characterized in that, in at least one layer of the coil section N (with $N \geq 2$), the superconducting wire sections are wound in parallel, such that the windings of the N wire sections are adjacent to each other and the N wire sections are connected in series.

In accordance with the invention, the at least one layer is not wound with one single continuous wire section but with N parallel wire sections. While the length of one continuous wire section should correspond to one layer length (or a multiple thereof), the N wire sections must only have a length of approximately (1/N)* layer length (or a multiple thereof). The layer length corresponds to the number of all wire windings in the layer multiplied by the coil periphery (thereby neglecting the axial extension of the coil). In turn, the number of wire windings in one layer substantially corresponds to the quotient between the coil length in the axial direction and the wire width.

In accordance with the invention, an increased fraction of each available wire piece can be utilized. The waste per wire section in accordance with the invention is less than (1/N)* layer length, while in prior art, the waste could amount up to one layer length (with only one wire section in one layer). In accordance with the invention, a wire piece of 1.9 layer lengths (see above) and N=4 parallel wire sections in each layer can e.g. be divided into seven wire sections of ¼ layer lengths each, leaving a rest of 1.9-1.75=0.15 layer lengths as waste. It must be noted that in accordance with the invention, several wire sections, in particular, wire sections of different layers may belong to one coherent wire piece.

In accordance with the invention, the windings of the superconducting wire in one layer are uniformly divided to the N wire sections, typically with a fixed, periodic sequence of windings of the individual wire sections along the longitudinal axis of the coil within one layer, thereby preventing wire crossings. Each wire section then has a slope of N wire widths per winding (thereby assuming that the wire type for all wire sections in one layer is the same).

In accordance with the invention, the N wire sections are connected in series in order to obtain a magnetic field in correspondence with one single, continuous wire in one layer, if required using joints outside of the coil. The series connection may also be effected indirectly, i.e. other coil sections (e.g. from higher or lower layers of from other coil sections) can be connected between the connected wire sections of one layer.

The inventive division of one layer into several, parallel wire sections is moreover advantageous in that the magnetic dipole moments of the magnetic field coil can be more finely quantized. For shielding, one part of a first coil section (main field coil) and one part of a second coil section (shielding coil) are typically connected in series and commonly bridged with a protective resistance. The two parts should thereby preferably have exactly opposite magnetic dipole moments. Since the contacts may be provided only at the coil edges, conventional compensation is effected in each case over an integer number of complete layers or their dipole moments. The invention also provides access to partial layers and their dipole moments.

Most of the layers, in particular, all layers of the at least one coil section advantageously have several parallel-wound wire sections.

Within the scope of the invention, the magnetic field coil or its coil sections typically have a solenoid shape.

In one preferred embodiment of the inventive magnetic field coil, each winding of the N wire sections of one layer is disposed, in non-positive engagement, next to the other. The windings thereby stabilize each other mechanically and conductor displacement or oscillations due to magnetic or external forces are prevented. This improves the field homogeneity and temporal stability of the magnetic field coil.

In another preferred embodiment, the wire sections of all layers are connected in series. This facilitates charging and operation of the magnetic field coil.

In another equally preferred embodiment, at least two coil sections are provided and the wire sections of all coil sections are connected in series. Two important examples for coil sections are a main field coil and a shielding coil. There may also be further or other subdivisions and coil sections. The series connection simplifies charging and operation.

In a preferred further development of this embodiment, the series connection of the wire sections extends from one wire section of a first coil section to a wire section of a second coil section and back again to a further wire section of the first coil section. Thus, wire sections with correlating properties from different coil sections can be connected e.g. for shielding or stray field flash prevention in case of a quench.

In one particularly preferred further development of the above-mentioned embodiment, the magnetic field coil comprises coil sections with different winding directions, enabling defined manipulation of the magnetic field, in particular, for homogenization or field weakening.

In a preferred further development of this design, the magnetic field coil is actively shielded, thereby protecting people and technical equipment in the surroundings of the magnetic field coil from stray fields.

In another advantageous embodiment, N=2 or N=3 or N=4. This number of parallel wire sections limits the expense for connections and greatly reduces the material costs. Even larger N values are mainly preferred for very expensive superconducting wires or superconducting wires which are available only with very short lengths.

In one particularly preferred embodiment of the inventive magnetic field coil, the coil areas of the magnetic field coil are bridged by protective ohmic resistances, such that these coil areas generate an approximately vanishing dipole moment during operation, wherein at least one of the coil areas comprises only part of the wire sections of a layer. The inventive fine subdivision of the magnetic field coil, which also provides access to parts of one layer, permits particularly exact compensation or shielding, such that particularly low stray fields can be achieved. The term "during operation" includes both normal operation and a quench, such that even a so-called stray field flash in case of a quench can be effectively prevented.

In another preferred embodiment, the wire sections of one layer have identical cross-sections, which facilitates winding of the superconducting wire onto the coil body, in particular, when several layers are wound directly on top of each other.

In another preferred embodiment, at least one coil section comprises several layers, permitting generation of larger field strengths.

Finally, in another preferred embodiment, the wire sections consist of NbTi and/or $Nb_3Sn$ and/or $MgB_2$ and/or high-temperature superconductor (HTSL), in particular YBaCuO and/or BiSrCaCuO conductors. These materials have proven to be useful in practice.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is illustrated in the drawing and explained in more detail with reference to embodiments.

DESCRIPTION OF THE PREFERRED EMBODIMENT

Figure 1B:
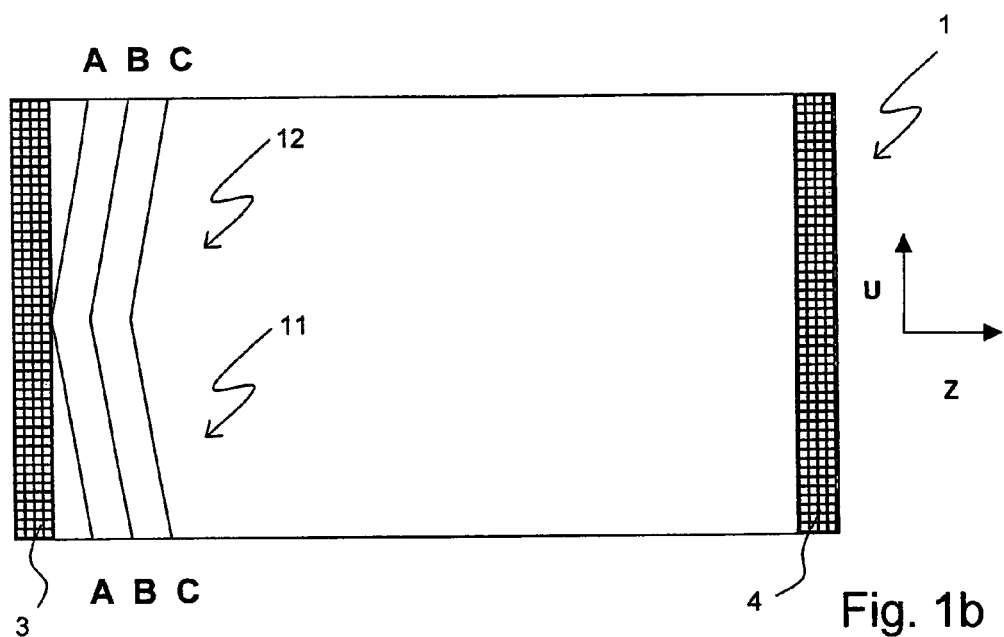
FIG. 1b shows a schematic top view of the inventive magnet coil of FIG. 1a at a layer change.
Figure 1A:
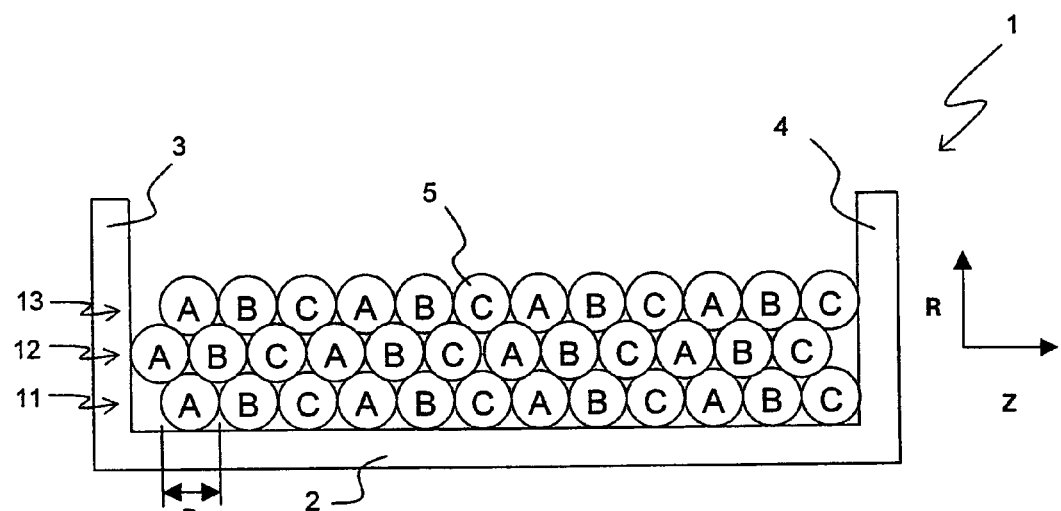
FIG. 1a shows a schematic cross-section through an inventive magnetic field coil with three parallel-wound wire sections per layer, wherein the wire sections are commonly turned during layer change.

FIG. 1a shows a cross-sectional view of part of an inventive magnetic field coil 1. The magnetic field coil 1 has a solenoidal shape. The axial direction is designated with Z and the radial direction with R. The magnetic field coil 1 has a coil carrier 2 onto which superconducting wire 5 has been wound with numerous windings. Each winding is shown in cross-section by a circle that corresponds to the cross-sectional profile of the wire 5. Only an upper partial section of the coil carrier 2 is visible. The actual coil carrier 2 has the shape of a circular cylindrical jacket. The magnetic field coil 1 also has a flange 3 on the left-hand side and a flange 4 on the right-hand side, which guide the wire 5.

The superconducting wire 5 is wound in several layers. FIG. 1 shows three layers 11, 12, 13, wherein 11 is the radially innermost and 13 the radially outermost layer.

The inventive particularity of the magnetic field coil 1 consists in that several wire sections A, B, C are wound in each layer 11, 12, 13.

The innermost layer 11 is e.g. wound in parallel from three wire sections A, B, C. The wire section A advances within one winding by three wire widths Br in the z direction, such that one winding of the wire sections B and C can be housed between two neighboring windings of the wire section A. The wire sections B and C are correspondingly wound. Each wire section A, B, C in one layer requires only approximately one third of the length ("layer length") of a continuous wire which would form one complete layer by itself.

The wire sections A, B, C within each layer 11, 12, 13, or to be more precise, the windings of the wire sections A, B, C directly abut each other. The position of the wire 5 is thereby stabilized through the "gap filling" offset in the z-direction.

As viewed in cross-section, one obtains a substantially two-dimensional, hexagonally tight packing.

In the embodiment of FIG. 1a, the wire sections A, B, C are wound together, i.e. the three wire sections A, B, C are always next to each other in the same order and are identically guided, i.e. one strand with the three wire sections A, B, C, is guided to the coil carrier 2 during winding. The wires of the wire sections A, B, C, may thereby be optionally glued to each other.

The common guidance becomes particularly clear in a layer change, e.g. from layer 11 on the left to layer 12. In layer 11, the strand "ABC" is wound to the left. The order of the wire sections A, B, C remains the same during and after layer change. In layer 12, the strand "ABC" is further wound to the right. The block of the wire sections A, B, C is commonly turned at the same peripheral position.

The layer change from layer 11 to layer 12 is additionally illustrated in FIG. 1b, wherein the wire sections A, B, C are shown as lines for simplification. FIG. 1b shows the winding state during layer change. It shows the Z-position of the wire sections A, B, C, in dependence on the peripheral position U. The wire sections A, B, C are turned (i.e. reverse their winding pitch) at the identical peripheral position. The position of the wire sections relative to each other remains the same.

It is, however, also possible to set a joint for one (or several) wire sections A, B, C during layer change, e.g. when the wire source for wire section A is insufficient for wire section A of the next layer 12. A joint would e.g. connect the wire section A of layer 11 to the wire section A in layer 12 at the left-hand edge of the magnetic field coil 1. The wire section A of layer 11 simply continues as wire section A without joint in layer 12.

Each wire section A, B, C, preferably has its own wire source during winding. A wire source with a glued strand for the wire sections A, B, C, may alternatively be provided.

Figure 2B:
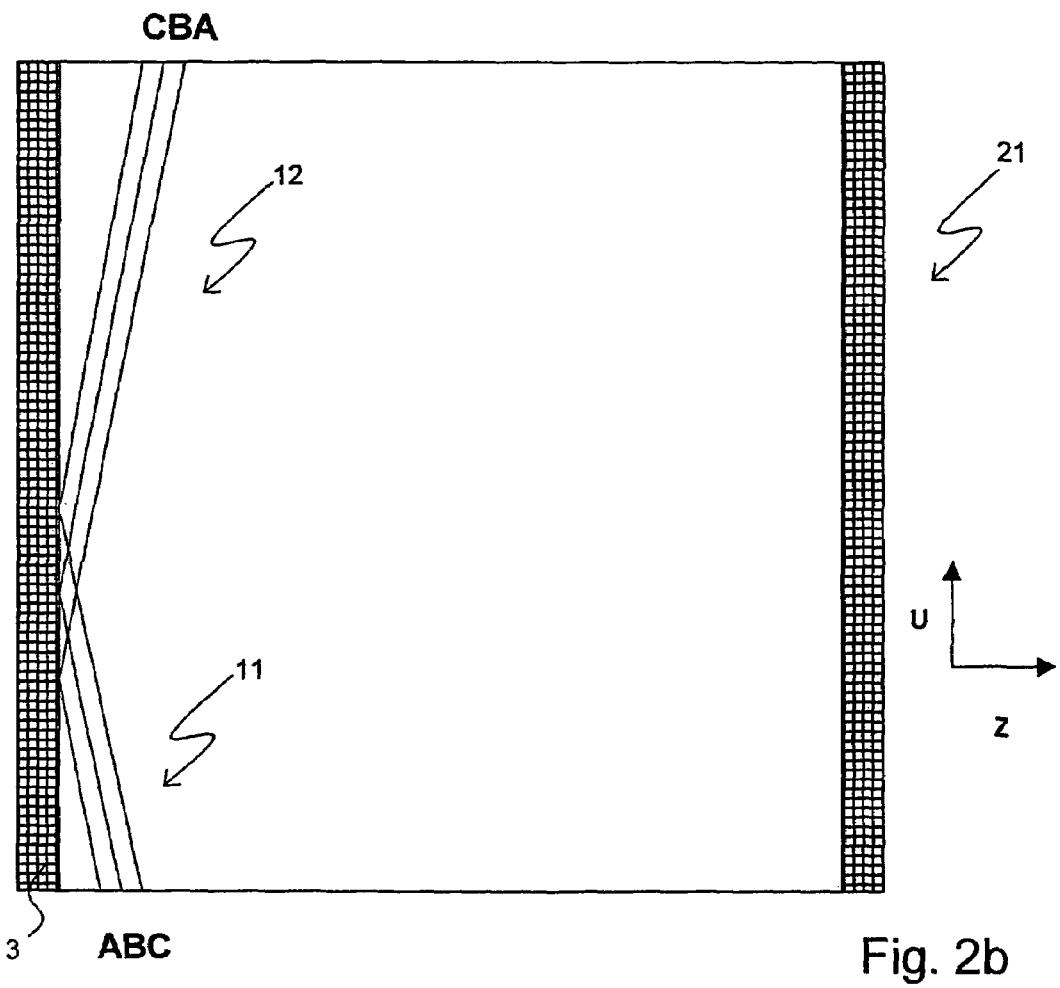
FIG. 2b shows a schematic top view of the inventive magnet coil of FIG. 2a at a layer change.
Figure 2A:
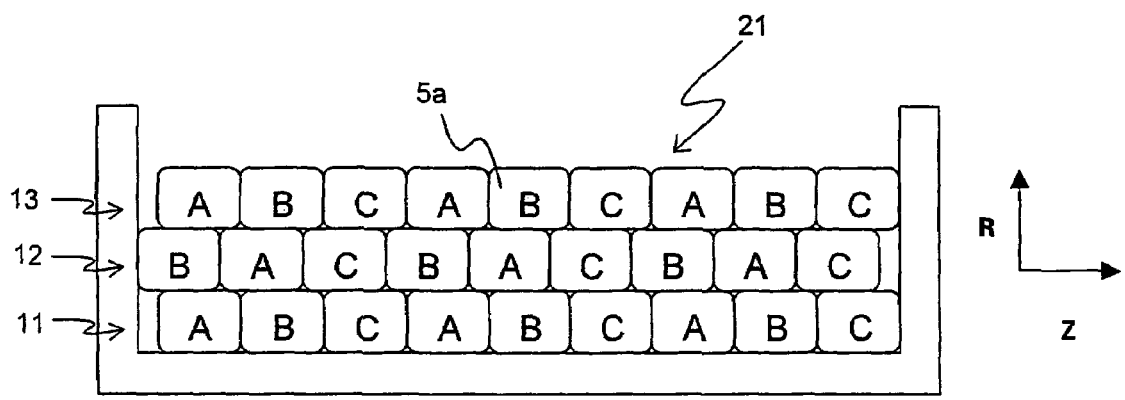
FIG. 2a shows a schematic cross-section through a further inventive magnetic field coil with three parallel-wound wire sections per layer, wherein the wire sections are individually turned during layer change.

FIG. 2a shows a similar inventive magnetic field coil 21 like in FIG. 1a. However, the superconducting wire 5a of the magnetic field coil 21 has an approximately rectangular cross-section. The magnetic field coil 21 also has several layers, of which three layers 11, 12, 13 are shown.

The wire sections A, B, C of the magnetic field coil 21 of FIG. 2a are guided individually and not together. This becomes clear in the layer change, e.g. between layer 11 and 12 at the left-hand edge.

When one single wire section A, B, C reaches the left-hand flange 3, this wire section is individually turned (i.e. the winding pitch is reversed). The wire sections A, B, C are thus individually reflected on the flange 3, thereby changing the order of the wire sections A, B, C during layer change. While a wire order "ABC" is wound in layer 11 to the left, the sequence in layer 12 is reversed "CBA" and wound to the right. This is explained in detail in FIG. 2b. The wire section A of layer 11 is reflected at first, then the wire section. B, and then the wire section C. For this reason, the order of the wire sections is reversed in the next layer above 12.

It is thereby also possible to set a joint for one or more wire sections A, B, C during layer change. Each wire section A, B, C has its own wire source during winding.

Figure 3:
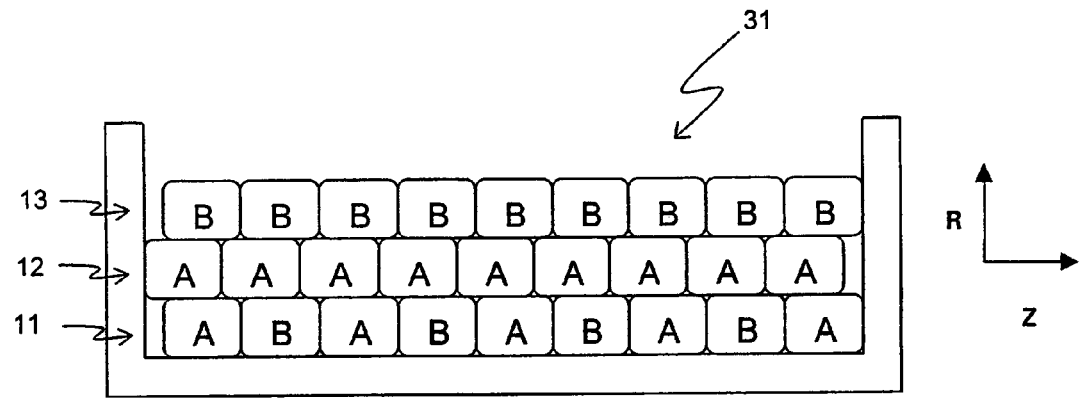
FIG. 3 shows a schematic cross-section through a further inventive magnetic field coil with changing number of wire sections per layer.

FIG. 3 shows a further magnetic field coil 31, wherein the wire sections A, B are wound in parallel only in the first layer 11, e.g. from the right to the left. In the next layer above 12, only one wire section A is returned to the right and in the next wire section above, the other wire section B is returned to the right.

Figure 4:
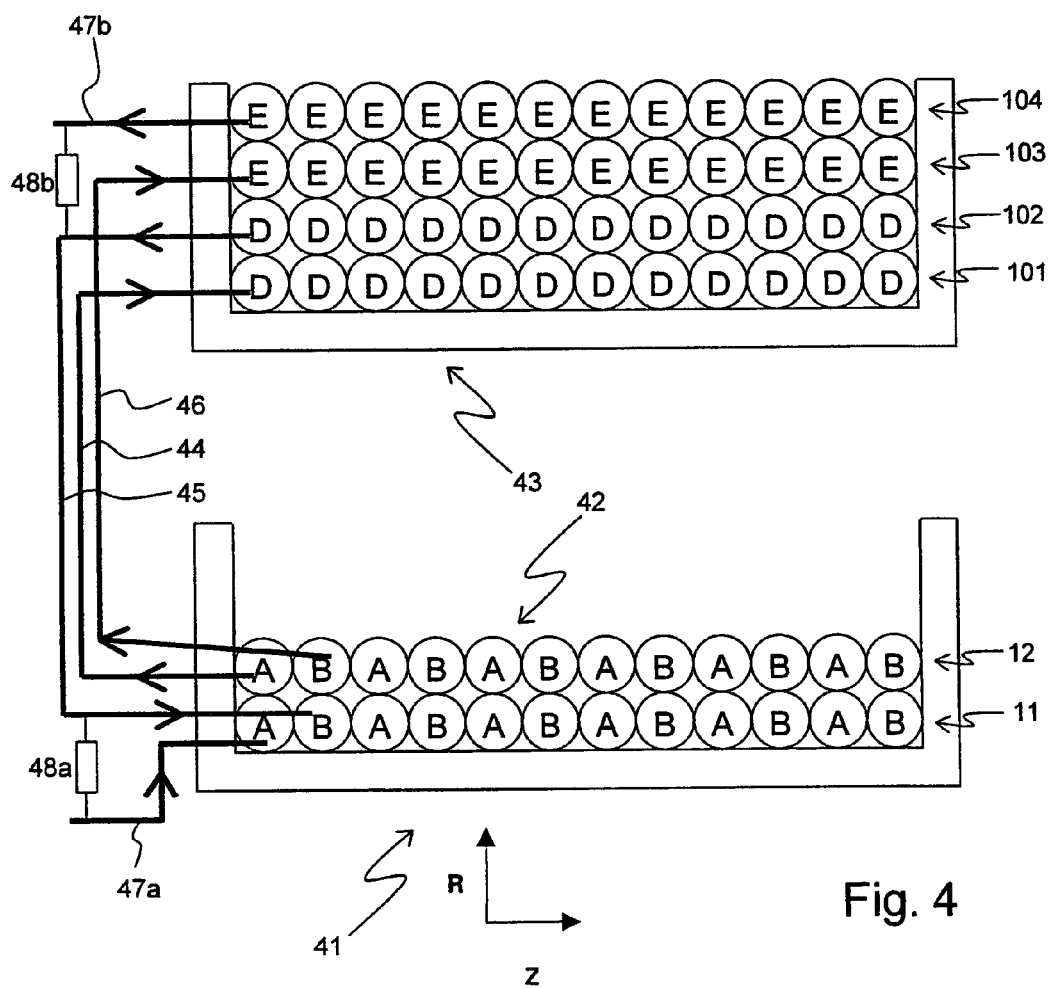
FIG. 4 shows a schematic cross-section through an inventive magnetic field coil with two coil sections with wiring diagram.

FIG. 4 shows a magnetic field coil 41 which has a first coil section 42 and a second coil section 43 which is coaxial thereto, with a wiring diagram. The first coil section 42 has two layers 11, 12 and the second coil section has four layers 101, 102, 103, 104. The second coil section 43 is wound in an opposite direction to the first coil section 42, such that the magnetic fields generated by the second coil section counteract those of the first coil section 42, thereby shielding the surroundings.

The current flows in series through all wire sections A, B, D, E and layers 11, 12, 101, 102, 103, 104 of the magnetic field coil 41 in the following order: the current is fed at connection 47a into the wire section A of layer 11 at the left-hand edge. At the right-hand coil edge, the wire section A merges from layer 11 into wire section A of layer 12 (normal layer, joint is possible). At the left-hand edge, the wire section A of layer 12 is connected to the wire section D in layer 101 via a joint 44. The wire section D of layer 101 merges at the right-hand edge into wire section D of layer 102. The left-hand edges of the wire section D of layer 102 and of the wire section B of layer 11 are then connected using a joint 45. The wire section B of layer 11 then merges into wire section B of layer 12 at the right-hand edge. The wire section B of layer 12 is, in turn, connected to wire section E of layer 103 via a joint 46. The wire section E of layer 103 merges at the right-hand edge into wire section E of layer 104. There is a second supply point 47b at the left-hand edge in the wire section E of layer 104.

The wire sections A and B of the layers 11 and 12 are connected to each other in series via the detour through the wire section D.

This magnetic field coil 41 additionally comprises protective ohmic resistances 48a, 48b. The protective resistance 48a commonly bridges the wire sections A of the layers 11, 12, and D of the layers 101, 102. In case of a quench in these wire sections (i.e. in this coil section), the resistance 48a may effect an emergency discharge. The wire sections A of the layers 11, 12 and D of the layers 101, 102 thereby have a magnetic dipole moment of approximately zero during operation. The wire sections B of the layers 11, 12 and E of layers 103, 104 are likewise bridged and secured by the protective resistance 48b. In total, these wire sections (or this coil section) also have an approximately vanishing dipole moment, thereby actively shielding the magnetic field coil 41.

Figure 5:
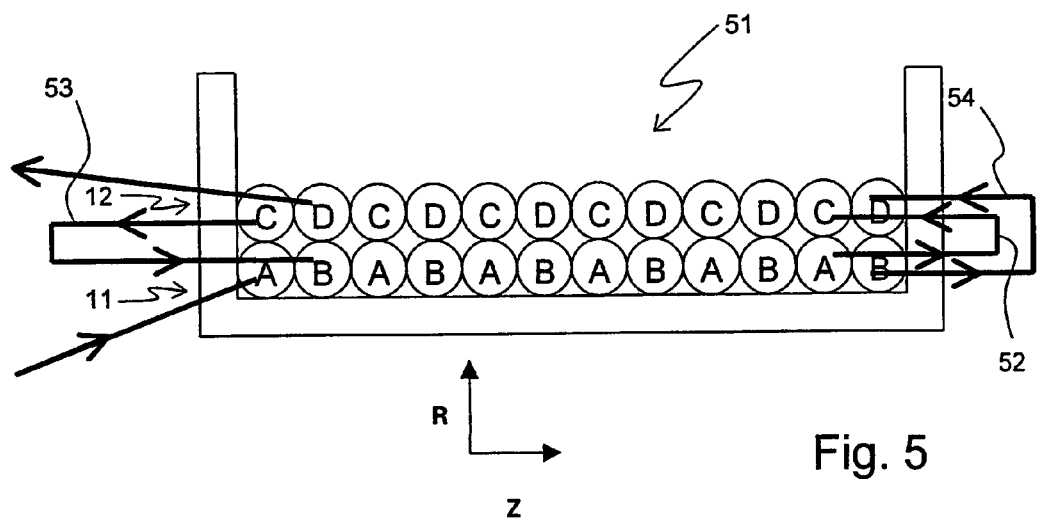
FIG. 5 shows a schematic cross-section through an inventive magnetic field coil with two layers with wiring diagram.

FIG. 5 shows a circuit of a simple inventive magnetic field coil 51 with only one coil section.

The current is fed into the wire section A of layer 11 at the left-hand edge. The wire section A is connected at the right-hand edge to the wire section C from the layer above via a joint 52. The wire section C is, in turn, connected to the wire section B of layer 11 at the left-hand edge via a joint 53. The wire section B is in turn connected to the wire section D of the layer 12 via joint 54 at the right-hand edge. Another supply point extends from the wire section D at the left-hand edge.

All wire sections A, B, C, D are thereby also connected in series.

Figure 6:
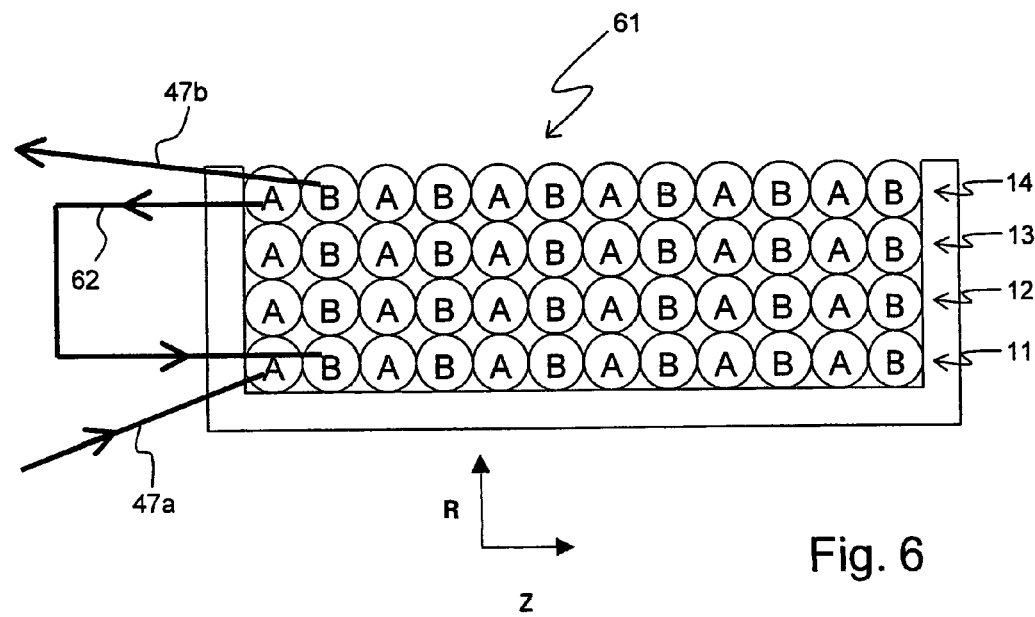
FIG. 6 shows a schematic cross-section through an inventive magnetic field coil with four layers with wiring diagram.

FIG. 6 shows a circuit of a further inventive magnetic field coil 61 which also comprises a coil section.

A supply point 47a contacts the wire section A of the layer 11 at the left-hand edge. The wire section A merges from the layers 11, via 12, 13, to 14 into the next upper layer (preferably without joint; joints may however be used at the layer changes at the edge in order to take into account a terminating source wire). A joint 62 connects the wire section A in layer 14 and wire section B in layer 11. The wire section B merges from layers 11 to 12, 13 and 14 (preferably also without joint). The wire section B in layer 14 has a connection 47b at the left-hand edge.

In summary, the invention proposes use, within one layer, of several wire sections which are not connected within the layer, for winding these layer windings in a superconducting magnetic field coil which typically has a solenoidal shape. Each wire section winds only part of the windings of the layer, but each wire section is guided over the entire width of the magnetic field coil. At the transition to neighboring layers, one can set joints to separate wire sections or continue the wire sections to the neighboring layers. The wire sections of one layer are connected in series in order to obtain a magnetic field as for one single continuous wire for one layer. The wire sections of one layer can be separately contacted, e.g. in order to form coil sections with vanishing dipole moment with high precision and bridge them with a protective ohmic resistance.

I claim:

1. A superconducting magnetic field coil comprising:
   at least one coil section wound in layers extending along an axis, wherein at least one layer of said coil section is not wound with one single continuous wire section, rather with N>=2 superconducting wire sections wound in parallel, said parallel wire sections extending along an entire axial extension of said at least one layer, wherein windings of said N parallel wire sections are adjacent to each other, with said N parallel wire sections being connected in series.

2. The magnetic field coil of claim 1, wherein windings of said N parallel wire sections of one layer abut each other in a non-positive fashion.

3. The magnetic field coil of claim 1, wherein said parallel wire sections of all layers are connected in series.

4. The magnetic field coil of claim 1, wherein at least two coil sections are provided and wire sections of all said coil sections are connected in series.

5. The magnetic field coil of claim 1, wherein at least two coil sections are provided and wire sections of all said coil sections are connected in series series connection of said wire sections extending from one said parallel wire section of a first coil section to a wire section of a second coil section and back to a further said parallel wire section of said first coil section.

6. The magnetic field coil of claim 1, wherein at least two coil sections are provided and said wire sections of all said coil sections are connected in series the magnetic field coil comprising coil sections with different winding directions.

7. The magnetic field coil of claim 6, wherein the magnetic field coil is actively shielded.

8. The magnetic field coil of claim 1, wherein N=3 or N=4.

9. The magnetic field coil of claim 1, wherein coil areas of the magnetic field coil are bridged by protective ohmic resistances said coil areas generating an approximately vanishing dipole moment during operation, wherein at least one of said coil areas comprises only part of said wire sections of one layer.

10. The magnetic field coil of claim 1, wherein said parallel wire sections of one layer have identical cross-sections.

11. The magnetic field coil of claim 1, wherein at least one coil section comprises several layers.

12. The magnetic field coil of claim 1, wherein said parallel wire sections consist essentially of NbTi, $Nb_3Sn$, $MgB_2$, high temperature superconductor (HTSL), YBaCuO and/or BiSrCaCuO conductors.

* * * * *